United States Patent [19]

Mitchell

[11] Patent Number: 4,979,005

[45] Date of Patent: Dec. 18, 1990

[54] FLOATING-GATE MEMORY CELL WITH TAILORED DOPING PROFILE

[75] Inventor: Allan T. Mitchell, Garland, Tex.

[73] Assignee: Texas Instruments Incorporated, Dallas, Tex.

[21] Appl. No.: 889,454

[22] Filed: Jul. 23, 1986

[51] Int. Cl.[5] .................... H01L 29/68; H01L 29/10; H01L 29/78; G11C 11/34

[52] U.S. Cl. .................................. 357/235; 357/23.4; 357/23.12; 365/184

[58] Field of Search ................... 357/23.4, 23.5, 23.12, 357/23.8, 59, 90, 91; 365/184

[56] References Cited

U.S. PATENT DOCUMENTS

| | | | |
|---|---|---|---|
| 3,891,468 | 6/1975 | Ito et al. | 357/90 |
| 4,017,888 | 4/1977 | Christie et al. | 357/23.5 |
| 4,021,835 | 5/1977 | Etoh et al. | 357/90 |
| 4,377,828 | 3/1983 | Kuo et al. | 357/23.5 |
| 4,521,796 | 6/1985 | Rajkanan et al. | 357/23.5 |
| 4,630,085 | 12/1986 | Koyama | 357/23.5 |
| 4,656,492 | 4/1987 | Sunami et al. | 357/23.8 |

FOREIGN PATENT DOCUMENTS 57-106079  7/1982  Japan .................. 357/23.5

OTHER PUBLICATIONS

S. Abbas, et al., "Short Chan., FET", IBM Tech. Discl. Bull., vol. 12, #11, Apr. 1975, p. 3263.
W. Muller et al., "Short-Chan., MOS Trans in Ava--Mult. Reg.", IEEE Trans. on Elec. Dev., vol. ED-29, #11, Nov. 1982, pp. 1778-1784.

Primary Examiner—Rolf Hille
Assistant Examiner—Wael Fahmy
Attorney, Agent, or Firm—Ferdinand M. Romano; James T. Comfort; Melvin Sharp

[57] ABSTRACT

A floating-gate memory cell with an improved doping profile. After the substrate background doping has been set to a desired level (e.g. by a high dose implant and long drive in), two implants of opposite type are used to shape the doping profile of the floating-gate transistor. A boron implant is used to provide significantly increased p-type doping underneath the channel, at depths near the midpoint of the source/drain diffusions. A shallow arsenic implant partially compensates this boron implant at the surface, to set the threshold voltage as desired. The region of substantially increased p-type doping helps to suppress the lateral parasitic bipolar transistor which can otherwise suppress programmation, and also (by providing increased doping at the drain boundary) increases hot electron generation.

36 Claims, 10 Drawing Sheets

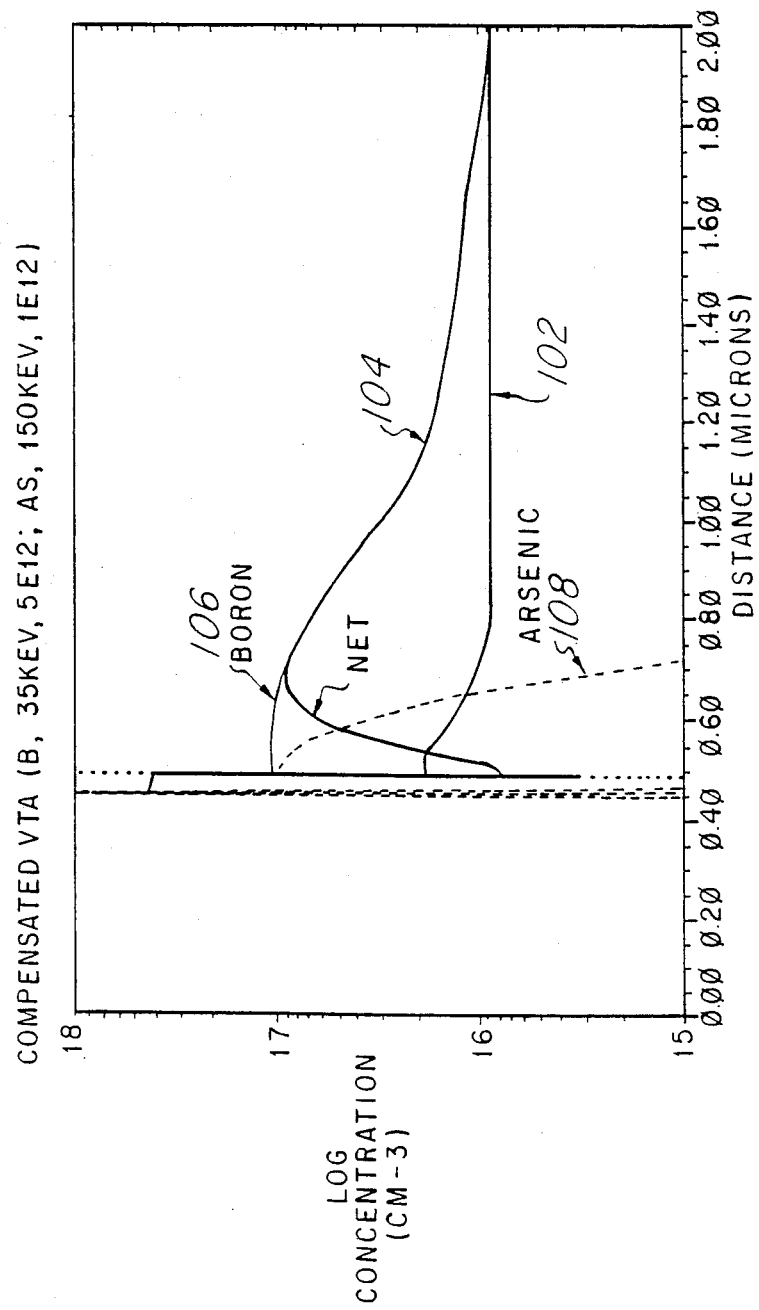

FLOATING-GATE MEMORY CELL WITH TAILORED DOPING PROFILE

BACKGROUND AND SUMMARY OF THE INVENTION

The present invention relates to non-volatile memory cells, and particularly to floating-gate non-volatile memory cells. The present invention is most relevant to EPROMSs, but could also be applied to related memory device types, such as EEPROMs.

FIGS. 1A and 1B show examples of EPROM device structures which have been previously discussed. FIG. 1A shows a device with planarized source and drain regions, and FIG. 1B shows an "advanced array" device with buried source and drain regions, invented at Texas Instruments (see, e.g., issued U.S. Pat. Nos. 4,151,021, 4,184,207, and 4,373,248, which are hereby incorporated by reference).

EPROM cells are normally programmed by applying large positive voltages to control gate 10 and also to one of the source/drain diffusions 14 (which acts as the drain), so that hot electrons are generated and injected through the oxide 11 into the floating gate 12. During the programmation operation, a typical set of applied voltages might be: gate voltage $V_G = 12.5$ Volts: source voltage $V_S = 0.5$ Volt: and drain voltage $V_D = 10$ volts. Hot electrons will be generated by the currents passing through high electric field regions, and some of these hot electrons will pass through the gate oxide into the floating gate. ("Hot electrons" are electrons which have more energy than is required for them to reach the conduction band. The energy of some of these carriers may be larger than the conduction band minimum of silicon dioxide, so that (until these carriers lose their excess energy by scattering processes) they can travel freely through a dielectric, unlike ordinary electrons.)

Since the floating gate is insulated, it will hold the charge thus injected for long periods of time. Since the floating gate is interposed between the control gate and the channel of the device, the charge on the floating gate will have a partial screening effect which causes the apparent $V_T$ of the transistor (as seen by the control gate) to change. Thus, a non-disturbing read operation can be performed by applying a read voltage to the control gate which is sufficient to turn on only those floating-gate transistors which do not have substantial charge stored on their floating gates. For example, the read voltages used might be $V_D = 1.5$, $V_G = 3$, $V_S = 0$.

EEPROMs use essentially the same read operation, but their programmation operation differs in that charge injection into the floating gate is performed using merely electric-field enhanced tunneling through a thin dielectric into the floating gate. Thus, during programmation of an EEPROM the source and drain will normally be held at approximately the same voltage, since hot carrier generation is not needed.

One of the key factors which is sought to be optimized in any floating gate memory device is the programming time. EPROMs and EEPROMs are fast-read, slow-write devices, and most system applications using them will perform write operations only infrequently, but when writing is too slow it can become a major detriment to system efficiency even in these kinds of applications. For example, at the programming speed specifications commonly accepted in merchant 64K EPROMs, a megabit EPROM would take 14 minutes to program. Thus, successive generations have had successively tighter specifications on programming time.

Since EPROM programming is done by hot electron injection, relatively large electric fields must be created in the semiconductor channel region to accomplish this. This in turn means that relatively high voltages must be used to generate these high electric fields. Moreover, there is a trade off between programming voltage and programming time: use of excessively high voltages on chip presents dangers of catastrophic breakdown, as well as requiring the overhead to generate and transmit these high voltages: but, if a lower programming voltage is used for a given device structure, the programming time will increase. Relatively slow programming times are commonly accepted in floating-gate memories, but it is always desirable to increase the speed of programmation.

One advantage of the present invention is that faster EPROM programmation is provided. In particular, for a given applied voltage between gate and source/drain, the present invention provides faster programmation than would otherwise be available.

Another problem of prior EPROM devices is the "bipolar effect." See Mueller et al., "Short-Channel MOS Transistors in the Avalanche-Multiplication Regime." 29 IEEE Transactions on Electron Devices 1778 (1982), which is hereby incorporated by reference. That is, the npn parasitic bipolar device (defined by the n-type source, the p-type substrate, and the n-type drain) may turn on during the programmation operation and effectively bring programmation to a halt. The programming conditions are designed to produce hot electrons, and some of these hot electrons will collide with atoms in the lattice to produce additional carriers. For example, one hot electron, after a collision event, may generate two electrons plus one hole. Under the applied electric field, the hole that is generated is likely to flow into the substrate near the source junction, and the density of this hole current can be high enough that its space charge will forward bias the source/substrate junction, which then operates as an emitter/base junction to emit electrons.

This is particularly a problem with the advanced array type transistor as shown in FIG. 1B, since, in these transistors, there is no thick field oxide laterally separating transistors, so the parasitic bipolar device has a tremendous effective width, and may conduct current all down one column once it turns on.

FIG. 9 shows two I-V curves for a sample EPROM cell. Curve 902 shows the I-V characteristics of the cell while it is being programmed. On this curve, the steep portion 901 shows the turn-on regime, and the relatively flat portion 903 shows the regime of saturated channel current, the region 904 of steeply declining current shows the regime where hot electron injection into the gate is occurring (and dynamically shifting the threshold voltage, and therefore reducing the current for a given drain voltage), and the portion 905 shows the regime where parasitic bipolar current becomes important. The operating point for programmation is typically selected at a higher drain voltage than is strictly necessary to reach the portion 904, to permit faster programmation. Another advantage of the present invention is that, since the parasitic bipolar turns on at a higher drain voltage, the programmation operating point 907 can optionally be selected higher on the I-V curve portion 905, i.e. higher voltages can optionally be used to achieve even more improvement in programming speed. The second I-V curve 906 shows (for comparison) the I-V characteristics of an EPROM cell after programmation.

A related parameter of the programming operation is the reliability of programmation. That is, even if the programming time of each bit is reasonably fast, a key parameter to the user is the net programming time. Prior devices will commonly achieve much less than 100% programmation per pass, and this lengthens programming time greatly. For example, if 90% of all bits program successfully on each pass, then a megabit memory would be expected to take six full programming cycles to complete programmation. The need for multiple program/read/reprogram cycles (known as "bit-banging") is heartily disliked by users.

Another constraint on EPROM device fabrication is that the substrate doping must be selected to accommodate the peripheral devices as well as the floating-gate transistors in the memory array. This means that if the substrate background doping concentration is simply increased to reduce the bipolar effect, then the peripheral devices will suffer increased body effect, which is undesirable, as well as greater parasitic capacitance to substrate, lower junction breakdown voltages, and increased leakage currents. Avoidance of these factors is particularly desirable where the peripheral circuits are CMOS, i.e. use both NMOS and PMOS transistors to conserve power.

The present invention improves all of these factors simultaneously, without seriously impeding fabrication of the cell.

The present invention provides an improved floating-gate transistor, with a different doping profile. In addition to the background p-well doping, and $V_T$-adjust doping to set the desired threshold voltage, the present invention also provides increased p-type doping below the channel and laterally adjacent to the source/drain diffusions. Preferably this is done by using two implants of opposite type at the stage when $V_T$-adjust implant of the floating-gate transistors in the memory array would normally be performed, namely both a p-type implant to provide the increased shallow p-type doping and a very shallow n-type implant of a low-diffusivity species, such as arsenic. Thus the doping at the surface of the channel (which defines the threshold voltage) can be kept to the desired level for threshold voltage control, but the dopant concentration below the channel and laterally adjacent to the source/drain diffusions will be substantially higher than the channel or substrate dopings. The increased doping at the drain boundary will cause increased hot electron generation, which means that faster programmation will be provided for a given applied voltage.

Thus, one key advantage of the present invention is increased hot electron generation during programmation, which means that faster programmation will be provided for a given applied voltage.

A further advantage of the present invention is that the action of the parasitic lateral bipolar transistor will be suppressed, since the space charge density of the additional ionized dopants introduced by the additional boron doping immediately below the channel will cause more of the electrons emitted at the source/substrate junction to diffuse upward into the channel (where they are actually beneficial), rather than diffusing laterally to cause the onset of bipolar action. Thus, since the bipolar effect is suppressed, the programming efficiency is therefore higher.

A further advantage of the present invention is that the device qualities of the transistors in the periphery need not be degraded by increased substrate doping.

Another advantage of the present invention is believed to be that while hot electron generation is enhanced during the write operation, it is not substantially increased during the read operation, and therefore data retention is not degraded by the improvement in write speed.

Note that the Mueller article cited above also discusses the utility of increased p-type doping below the channel in reducing the "bipolar effect." The "type B" process described on page 1779 uses a very deep implant (1.2E12 cm$^{-2}$ of (presumably) boron at 140 keV) to achieve a dopant profile, as shown in FIG. 2, which peaks below the surface. (This doping profile is probably not directly comparable to the profile shown as FIG. 10, since it is not clear that the Mueller article is showing as-annealed profiles; the doping peak is shown at about the depth where the as-implanted peak of a 140 keV implant would be expected to fall, and therefore these may be as-implanted profiles or inaccurately modeled simulations of as-annealed profiles.) However, it is clear that the example of FIG. 10 shows a substantially higher peak doping at a substantially shallower depth than any teaching of the Mueller et al, article. The Mueller et al, article is not seen to contain any suggestion of an n-type $V_T$ implant together with a p-type implant, nor is it seen to contain any suggestion of optimizing the doping profiles of the NMOS peripheral transistors differently from those of the array transistors: nor is it seen to contain any teaching of the criticality of the relation between peak doping depth and source/drain diffusion depth. The present invention goes beyond the teachings of the Mueller et al, article in these respects and others, and as a result provides substantial advantages. For example, the present invention permits the memory transistors and the PMOS and NMOS peripheral transistors to all have separately optimized doping profiles, with a minimum cost in process steps. The use of a low-diffusivity n-type counter-dopant means that the peak p-type doping concentration in the memory transistors can be located closer to the surface, and this in turn means that advantages of increased programming speed (due to increased hot electron generation) result.

The $V_T$-adjust implants of the memory array are preferably done after any required high temperature steps, specifically after field oxidation (or thick field oxide growth) to minimize the integral of $\sqrt{Dt}$ and therefore permit the peak of the boron compensating implant to occur close to the surface.

Arsenic is preferred for the $V_T$-adjust implant, to minimize its integral $\sqrt{Dt}$ by minimizing D. That is, in the presently preferred embodiment the boron implant has only a slightly longer stopping distance than the arsenic implant (roughly 1100 Å for the boron and 850 Å for the arsenic): however, the difference in their diffusivities means that subsequent diffusion will further shift the boron profile relative to the arsenic profile. The dinal dopant profiles—i.e. the profiles in the finished device—are what determine the device characteristics, and the presently preferred embodiment provides final dopant profiles such that $$X_{B-50\%} > 2X_{As-50\%},$$

i.e. the boron concentration is 50% less than its peak value at a depth more than twice the depth where the arsenic concentration is 50% less than its peak value. More particularly, it is also preferred that $$2X_j > X_{B-50\%} > 2X_{As-50\%},$$

i.e. that the boron concentration has tapered off to half its maximum at a depth less than twice the depth of the source/drain bottom junction.

Another teaching of the present invention regarding final dopant profiles is that $n_{max(x \leq 0.5 \mu m)}$ (the largest value of the net p-type dopant concentration anywhere within the volume extending from 0 to 0.5 microns below the gate oxide/channel interface) is more than 1.5 times $n_{chan}$ (the net p-type dopant concentration in the channel at the gate oxide/channel interface):

$$n_{max(x \leq 0.5 \mu m)} > 2/3(n_{chan}).$$

Preferably, $n_{max(x \leq 0.5 \mu m)}$ is more than 1.5 times $n_{chan}$ and is also more than twice $n_{sub}$ (the net p-type background dopant concentration in the substrate):

$$n_{max(x \leq 0.5 \mu m)} > 2/3(n_{chan})$$

AND $$n_{max(x \leq 0.5 \mu m)} > 2(n_{sub}).$$

Once these teachings of the present invention are appreciated, it may be seen that other processing sequences could be used to achieve the desired dopant profile as taught by the present invention.

For example, antimony could be used for the shallow n-type implant which adjusts $V_T$. Even phosphorus could be used instead, although in that case a higher implant energy would be used for the boron implant, to assure that increased net p-type doping occurred below the channel as discussed above. Similarly, those skilled in the art can easily configure a wide range of implant dose, implant energy, and annealing time and temperature specifications which will provide the structure taught by the present invention by various routes, although there are particular advantages to the specific preferred process embodiments claimed.

FIG. 10 shows the doping profiles achieved (in one embodiment of the invention) for the NMOS peripheral transistors (curve 102) and for the floating-gate memory transistors (curve 104). Separate profiles are also broken out for the atomic boron concentration $n_B$ (curve 106) and for the atomic arsenic concentration (curve 108). Note that the boron concentration profile is compensated at shallow depths (in this example, down to about 0.2 microns below the gate oxide), so that the surface concentration is reduced to the level desired to set the "erase $V_T$" i.e. the $V_T$ of a cell which has not been programmed) of the memory cells.

Note that the curve 102 shows a slightly increased doping level at the surface, to set the $V_T$ of the NMOS peripheral transistors to a desired level. This points up an important further advantage of the invention: it is normally necessary, in an EPROM process, to set the surface doping concentration differently for the NMOS peripheral transistors and for the memory transistors. That is, a simple mask level must be used anyway to pattern the different threshold implants, so the mask used (in the presently preferred embodiments) to apply the arsenic $V_T$ implant to the memory transistors only does not actually cost an additional masking step.

DESCRIPTION OF THE PREFERRED EMBODIMENTS

According to the present invention there is also provided: A floating-gate memory device comprising: a substrate having a p-type upper portion; first and second heavily doped n-type source/drain regions separated to define a channel region in said p-type upper portion; a gate oxide overlying said channel region, and a floating gate overlying said gate oxide: a control gate overlying and insulated from said floating gate: wherein the largest value of the net p-type dopant concentration anywhere within the volume of said p-type upper portion extending from 0 to 0.5 microns directly below the interface between said gate oxide and said channel region is more than 1.5 times the net p-type dopant concentration in said channel region at the interface between said gate oxide and said channel region.

According to the present invention there is also provided: A floating-gate memory device comprising: a substrate having a p-type upper portion: first and second heavily doped n-type source/drain regions separated to define a channel region in said p-type upper portion; a gate oxide overlying said channel region, and a floating gate overlying said gate oxide: a control gate overlying and insulated from said floating gate: wherein the largest value of the net p-type dopant concentration anywhere within the volume of said p-type upper portion extending from 0 to 0.5 microns directly below the interface between said gate oxide and said channel region is more than 1.5 times the net p-type dopant concentration in said channel region at the interface between said gate oxide and said channel region, and is also more than twice the net p-type background dopant concentration in the substrate.

According to the present invention there is also provided: A floating-gate memory device comprising: a substrate having a p-type upper portion; first and second heavily doped n-type source/drain regions separated to define a channel region in said p-type upper portion: a gate oxide overlying said channel region, and a floating gate overlying said gate oxide; a control gate overlying and insulated from said floating gate; wherein said upper portion of said substrate directly beneath said gate oxide includes both atoms of a p-type dopant species and atoms of an n-type dopant species, said p-type dopant species and said n-type dopant species having vertical concentration profiles such that the depth at which the concentration of said p-type dopant species declines to 50% less than its near-surface peak value is more than two times the depth at which the concentration of said n-type dopant species declines to 50% less than its near-surface peak value.

According to the present invention there is also provided: A floating-gate memory device comprising: a substrate having a p-type upper portion: first and second heavily doped n-type source/drain regions separated to define a channel region in said p-type upper portion; a gate oxide overlying said channel region, and a floating gate overlying said gate oxide: a control gate overlying and insulated from said floating gate: wherein said upper portion of said substrate directly beneath said gate oxide includes both atoms of a p-type dopant species and atoms of an n-type dopant species, said p-type dopant species and said n-type dopant species having vertical concentration profiles such that the depth at which the concentration of said p-type dopant species declines to 50% less than its near-surface peak value is more than two times the depth at which the concentration of said n-type dopant species declines to 50% less than its near-surface peak value, and the depth at which the concentration of said p-type dopant species declines to 50% less than its near-surface peak value is less than the depth of said source/drain diffusions.

According to the present invention there is also provided: A method for fabricating a non-volatile memory cell, comprising the steps of: providing a substrate having a crystalline silicon upper portion: introducing a heavy dose of an n-type dopant approximately in predetermined locations of source/drain regions: growing an oxide on said silicon upper portion while simultaneously activating said source/drain implants, said source/drain dopant introduction step and said oxidizing step defining lines of source/drain diffusions having moat areas therebetween: introducing, activating, and diffusing dopants in said moat areas to provide, in said upper portion of said substrate directly beneath said gate oxide, both atoms of a p-type dopant species and atoms of an n-type dopant species, said p-type dopant species and said n-type dopant species having respective vertical concentration profiles such that the depth at which the concentration of said p-type dopant species declines to 50% less than its near-surface peak value is more than two times the depth at which the concentration of said n-type dopant species declines to 50% less than its near-surface peak value; providing patterned floating gates and control gates overlying portions of said moat regions, plural ones of said control gates running across said moat regions and isolation regions to define floating gate transistors where said control gate crosses said moat regions, said floating gate portions at said transistor locations being insulated from said silicon moat region and also from said control gate: wherein, prior to said step of introducing, activating, and diffusing dopants in said moat areas, said upper portions of said substrate already have a net dopant density $n_{sub}$ of at least $10^{16}$ p-type.

According to the present invention there is also provided: A method for fabricating a non-volatile memory cell, comprising the steps of: providing a substrate having a crystalline silicon upper portion: introducing a heavy dose of an n-type dopant approximately in predetermined locations of source/drain regions; growing an oxide on said silicon upper portion while simultaneously activating said source/drain implants, said source/drain dopant introduction step and said oxidizing step defining lines of source/drain diffusions having moat areas therebetween: introducing, activating, and diffusing dopants in said moat areas to provide, in said upper portion of said substrate directly beneath said gate oxide, both atoms of a p-type dopant species and atoms of an n-type dopant species, and p-type dopant species and said n-type dopant species having vertical concentration profiles such that the depth at which the concentration of said p-type dopant species declines to 50% less than its near-surface peak value is more than two times the depth at which the concentration of said n-type dopant species declines to 50% less than its near-surface peak value, and the depth at which the concentration of said p-type dopant species declines to 50% less than its near-surface peak value is less than the depth of said source/drain diffusions; and providing patterned floating gates and control gates overlying portions of said moat regions, plural ones of said control gates running across said moat regions and isolation regions to define floating gate transistors where said control gate crosses said moat regions, said floating gate portions at said transistor locations being insulated from said silicon moat region and also from said control gate; wherein, prior to said step of introducing, activating, and diffusing dopants in said moat areas, said upper portions of said substrate already have a net dopant density $n_{sub}$ of at least $10^{16}$ p-type.

According to the present invention there is also provided: A method for fabricating a non-volatile memory cell, comprising the steps of: providing a substrate having a crystalline silicon upper portion: introducing an n-type dopant into said upper portion of said substrate approximately in predetermined locations of PMOS peripheral devices in a dosage sufficient to dope said predetermined locations of PMOS devices to a level which after subsequent steps will produce a concentration greater than $1E16$ cm$^{-3}$ n-type: introducing a p-type dopant into said upper portion of said substrate approximately in predetermined locations of NMOS peripheral devices and also approximately in predetermined locations of floating-gate memory devices in a dosage sufficient to dope said predetermined locations of NMOS and floating-gate devices to a level which after subsequent steps will produce a concentration in the range of $8E15$ to $3E16$ cm$^{-3}$ p-type; providing device isolation regions separating multiple predetermined active device areas of said NMOS and PMOS peripheral devices; introducing a heavy dose of an n-type dopant approximately in predetermined locations of source/drain regions of floating-gate devices; forming an oxide over said locations of source/drain regions of said floating-gate devices while simultaneously activating said source/drain implants, said source/drain dopant introduction step and said oxidizing step defining lines of source/drain diffusions having moat areas therebetween; introducing, activating, and diffusing dopants in said moat areas to provide, in said upper portion of said substrate directly beneath said gate oxide, both atoms of a p-type dopant species and atoms of an n-type dopant species, said p-type dopant species and said n-type dopant species having respective vertical concentration profiles such that the depth at which the concentration of said p-type dopant species declines to 50% less than its near-surface peak value is more than two times the depth at which the concentration of said n-type dopant species declines to 50% less than its near-surface peak value; providing patterned floating gates overlying portions of said moat regions, plural ones of said control gates running across said moat regions and isolation regions to define floating gate transistors where said control gate crosses said moat regions, said floating gate portions at said transistor locations being insulated from said silicon moat region and also from said control gate: and providing gates and source/drains to provide NMOS devices in said NMOS peripheral device areas and PMOS devices in said PMOS peripheral device areas: and providing insulated metal lines making contact to said NMOS and PMOS peripheral devices to provide input and output circuits for said floating-gate transistors in said memory cell array.

BRIEF DESCRIPTION OF THE DRAWINGS

The present invention will be described with reference to the accompanying drawings, wherein:

FIG. 10 shows the doping profiles achieved (in one embodiment of the invention) for the NMOS peripheral transistors and for the floating-gate memory transistors.

DESCRIPTION OF THE PREFERRED EMBODIMENTS

Figure 1A:
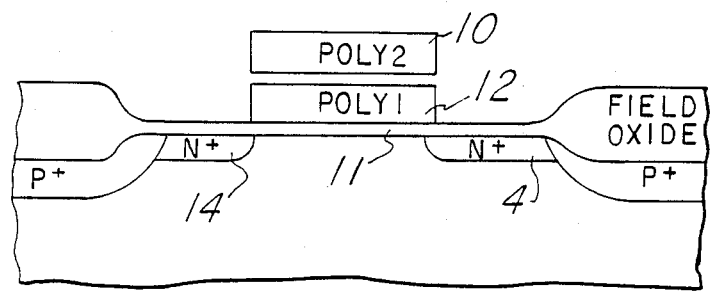
FIGS. 1A and 1B show examples of floating-gate memories which have been previously discussed, and into which the structural novelties taught by the present invention may be incorporated.

The making and use of the presently preferred embodiments will now be discussed in great detail. However, it should be appreciated that the present invention provides widely applicable inventive concepts, which can be embodied in a tremendous variety of specific contexts; the specific embodiments discussed are merely illustrative of specific ways to make and use the invention, and do not delimit the scope of the invention.

The currently preferred best mode of fabrication of a sample EPROM, including floating-gate memory transistor structures like that shown in FIG. 1B as well as CMOS peripheral devices, will now be described in detail.

1. The starting material is a p-type (e.g. $\rho = 12-15$ Ω-cm) <100> epitaxial wafer (with 12-15 microns of epi over a p+ substrate).

2. An initial oxidation at 900 C. in steam grows about 350 Å of oxide. About 1400 Å of nitride is then deposited by LPCVD. This oxide/nitride stack is patterned and plasma etched, and an n-type implant (masked by the photoresist/nitride/oxide stack) is then performed, e.g. 6E12 cm$^{-2}$ of phosphorus at 100 keV. This will provide the doping for the n-wells in the CMOS periphery.

3. The resist is then stripped, and a "color reversal" oxide is grown on areas not protected by the oxide/nitride stack, e.g. to 5300 Å at 1000 C. in steam. The nitride is then deglazed and stripped, and a p-type implant is performed, e.g. 3E12 cm$^{-2}$ of boron at 50 keV.

4. The existing "color reversal" oxide is then stripped, and a tank oxide is grown (e.g. to 350 Å by a 1000 C. oxidation in O$_2$+5% HCl), and the p-well and n-well dopants are then driven in, e.g. by 700 minutes in argon at 1100 C. During this drive in step the tank dopants will diffuse downward (as well as laterally), and the p+ substrate doping will diffuse up as well. This step defines the background substrate dopant concentration of the memory cell array, which (in this example) is approximately $n_{sub} = 1E16$ cm$^{-3}$. The optimal substrate doping is selected with reference to the requirements of the NMOS peripheral devices as well as the requirements of the floating-gate transistors in the memory array: in this example, the effective lengths of the peripheral and floating-gate devices are respectively $L_{eff(periphery)} \approx 1.5$ μm and $L_{eff(array)} \approx 1.2$ μm. In another example of the present invention, where $L_{eff(periphery)}$ is decreased to 1.2 μm, the $n_{sub}$ is increased to 2E16 cm$^{-3}$. In general, $n_{sub}$ is scaled roughly as the inverse of $L_{eff(periphery)}$ (or $L_{eff(array)}$, whichever is greater), within a range slightly broader than that defined by the above examples. That is, $$0.6 < \frac{n_{sub}}{\max(L_{eff(array)} \cdot L_{eff(periphery)})} < 1.8.$$

5. The moats (active device areas, separated by field isolation) are now defined conventionally in the periphery. For example, silicon nitride is LPCVD deposited, patterned and etched to expose the active device areas. A channel stop implant (e.g. 8.5E12 cm$^{-2}$ of boron at 100 keV, screened by the photoresist/nitride stack) is performed, after which the resist is stripped and field oxide is grown on the moat areas, e.g. to 9500 Å by a 900 C. steam oxidation.

6. The buried N+ source/drain regions will now be formed. Photoresist is patterned to expose the locations of these in the memory cell array area, and the exposed nitride in these locations is etched. N-type dopant is now implanted (screened by the photoresist/nitride stack in the array, and by the photoresist in the periphery), e.g. 5E15 cm$^{-2}$ of arsenic at 50 keV, and the photoresist is stripped. The buried n+ regions are now annealed (e.g. 100 minutes in argon at 900 C.) and then oxidized (e.g. 40 minutes in steam at 900 C., which will produce about 4500 Å of oxide over the buried n+ regions and much less elsewhere). The nitride is then stripped, and a short deglaze is used to remove oxide everywhere except for the field oxide isolation regions in the periphery and the buried n+ oxide in the array. (This deglaze step is preferably kept short enough that it does not erode any large percentage of these thick oxide regions, but a loss of a hundred or a thousand Å will generally not cause problems.)

7. A dummy gate oxidation (e.g. growth of 350 Å in steam at 900 C.) is now followed by an implant which sets the threshold voltage of the floating gate transistors, e.g. 3E12 cm$^{-2}$ of boron at 35 keV followed by 7E11 cm$^{-2}$ of arsenic at 150 keV. These implants, together with the earlier p-well implant and drive, provide the advantageous doping profile extensively discussed above. Patterned photoresist screens this implant except in the array.

8. The remaining process steps are generally conventional. The photoresist and dummy gate oxide are now stripped, and the gate oxide is grown (e.g. to 350 Å, using O$_2$ plus HCl). The first layer of polysilicon is now deposited (e.g. to 3000 Å). POCl$_3$-doped, deglazed, patterned, and etched as desired. (This level is used for the floating gates of the memory devices in the array.) Interlevel dielectric is now deposited (e.g. 250 Å nitride, LPCVD-deposited at 800 C.). The array is then covered with photoresist, and the interlevel dielectric is stripped from the periphery.

9. After photoresist-strip and deglaze steps, the second gate oxide is grown (e.g. to 400 Å). Boron is implanted overall (e.g. 5E11 cm$^{-2}$ at 35 keV) to set the threshold voltage of the NMOS devices in the periphery, and a second boron implant (e.g. 8E11 cm$^{-2}$ at 35 keV), masked to hit only the PMOS peripheral device areas, sets the threshold voltages of the PMOS peripheral devices.

10. After another photoresist-strip step, the second polysilicon layer is deposited (e.g. to 3000 Å). $POCl_3$-doped, deglazed, and sputter coated with silicide (e.g. 2500 Å of tungsten silicide). The gate level of the NMOS and PMOS peripheral devices is now patterned and etched.

11. The second polysilicon layer is now patterned again, and a stack etch is used to etch the control gate, interlevel dielectric, and floating gate in the array. While this mask level is in place, a bitline isolation implant is performed (e.g. 1E12 $cm^{-2}$ of boron at 70 keV). This implant will hit only the spaces which separate adjacent floating-gate devices along the length of the wordlines (i.e. the buried n+ source/drain diffusions). The remaining photoresist is then stripped.

12. A cap oxide is now grown on the exposed polysilicon (and incidentally also on exposed silicon portions), e.g. by 30 minutes in $O_2$ at 1000 C. Patterned n-type and p-type implants are now applied to the NMOS and PMOS regions of the periphery, to define the two types of source/drain regions required. The remaining photoresist is then stripped.

13. Borophosphosilicate glass (BPSG) is now deposited (over a pad oxide) and densified, and contacts are patterned and etched conventionally. The remaining photoresist is then stripped.

14. Metal is deposited, patterned, etched and sintered conventionally, and a protective overcoat is deposited, patterned, and etched. This provides a finished device ready for packaging.

FIGS. 2–8 show actual comparative test results for comparable floating-gate devices made with and without the present invention. The devices of FIGS. 2–5 were made using a double implant, as described in the process flow above, to set the threshold voltage and produce the doping profile taught by the present invention, and the devices of FIGS. 6–8 were made using a single boron implant (1.5E12 $cm^{-2}$ at 35 keV) to set the threshold voltage.

Figure 1B:
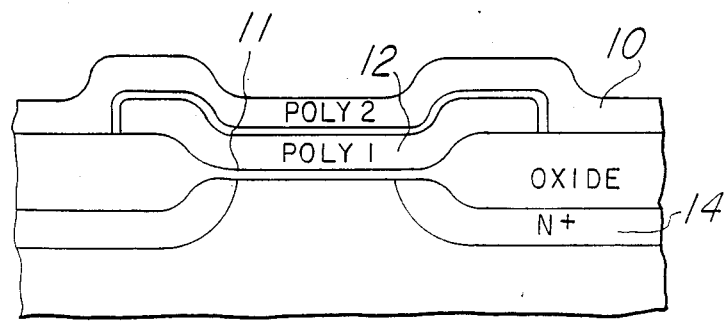

Each of the seven tested devices was a 64K EPROM integrated circuit, including cells approximately as shown in FIG. 1B. Each received a 12.5 Volt ½ msec programming pulse, which should ideally inject enough electrons onto the floating gate to raise the effective threshold voltage of the device up to somewhere in the neighborhood of 8 Volts. For each device, all of the cells which had been thus programmed were then measured during read operations at various voltages, to ascertain how many of the cells on the device had failed to program, and what the effective threshold voltage of the programmed cells was.

Figure 2:
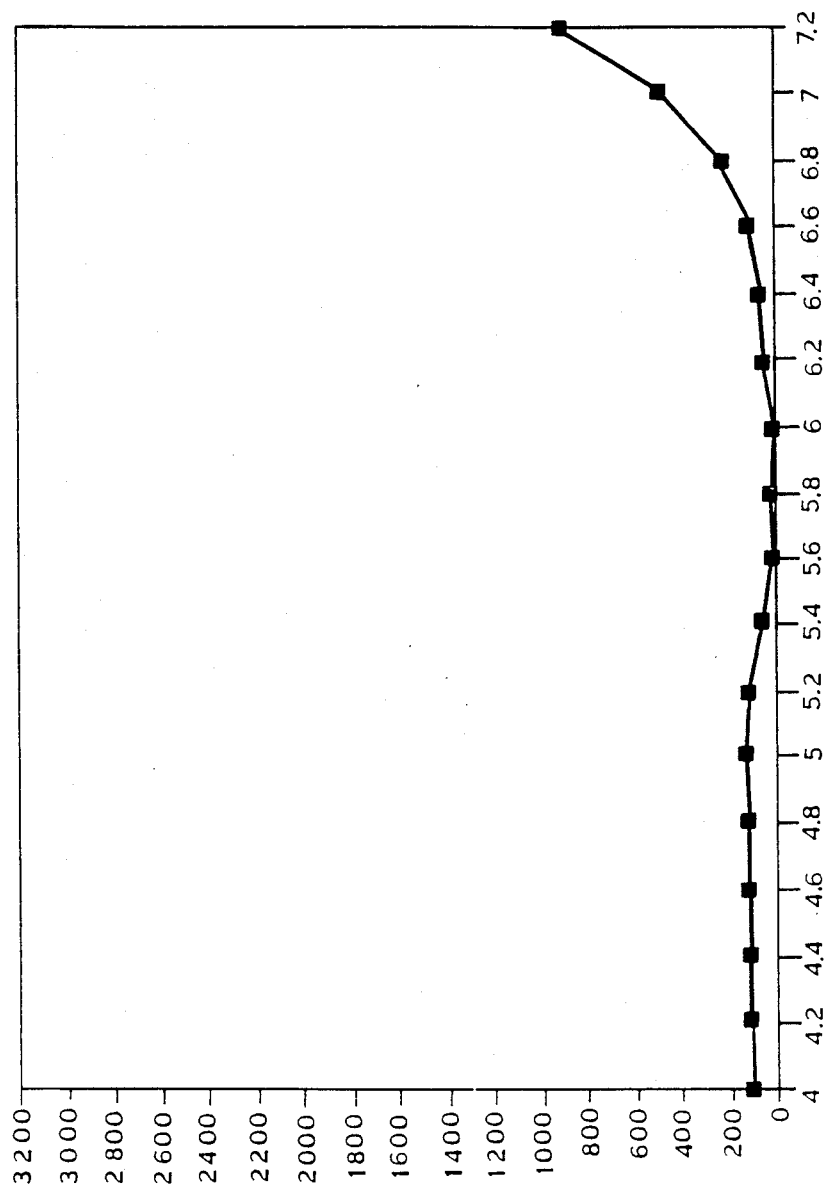
FIGS. 2-8 show actual comparative test results for comparable floating-gate devices made with and without the present invention. The devices of FIGS. 2-5 were made using a double implant, as described in the process flow above, to set the threshold voltage and produce the doping profile taught by the present invention, and the devices of FIGS. 6-8 were made using a single boron implant (1.5E12 cm$^{-2}$ at 35 keV) to set the threshold voltage.

The graphs of FIGS. 2–8 each show, for the particular device tested, the number of bytes (of a total of 8000 bytes) which turned on (i.e. which had failed to program) for the read voltages shown on the horizontal axis. These results show:

The device of FIG. 2 had approximately 10 bytes fail to program, and the cells which did program had threshold voltages clustered at about 6.9 Volts and upwards.

Figure 3:
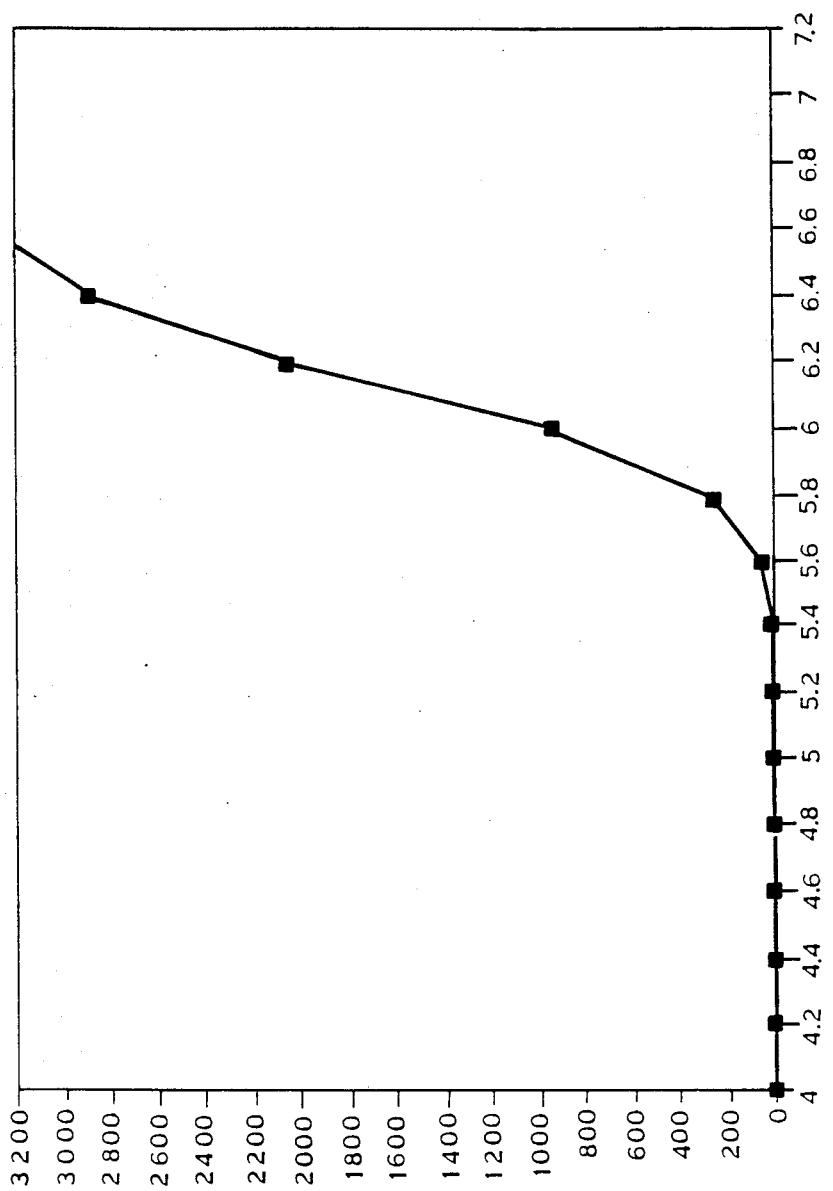

The device of FIG. 3 had approximately 0 (zero) bytes fail to program, and the cells which did program had threshold voltages clustered at about 5.8 Volts and upwards.

Figure 4:
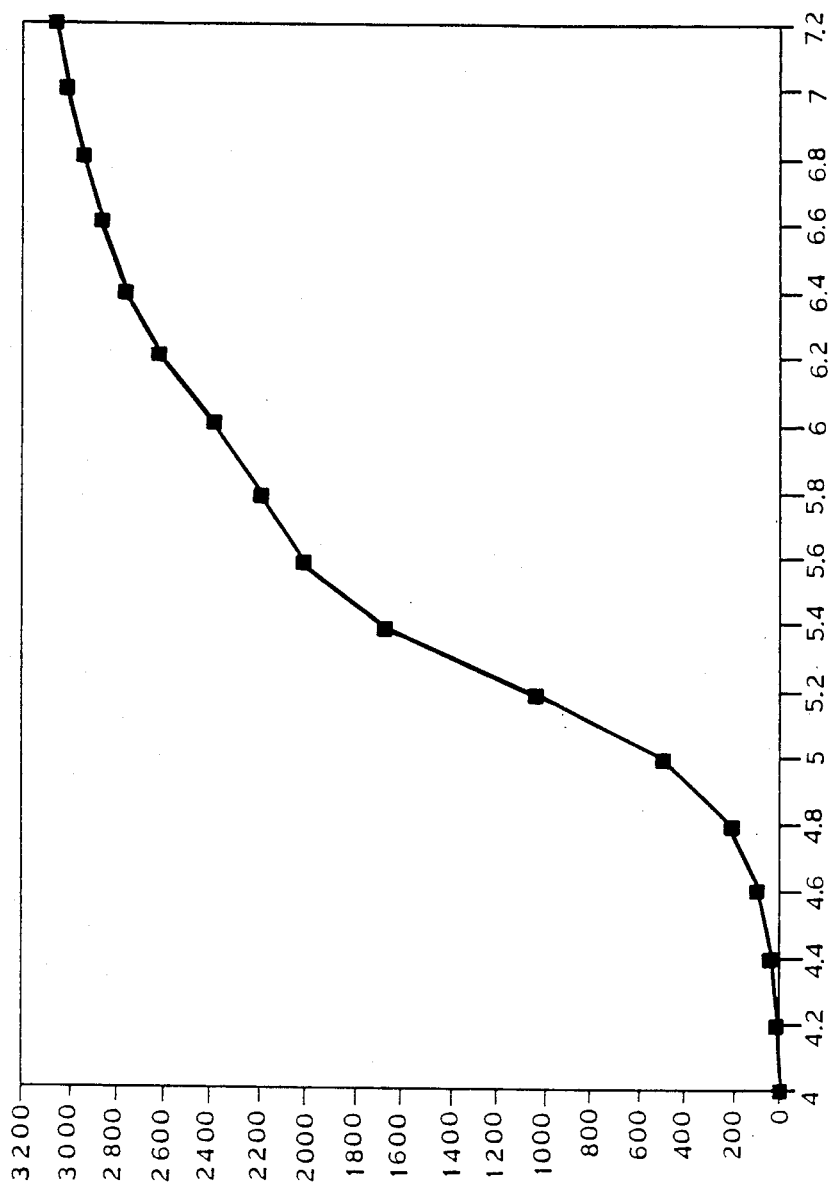

The device of FIG. 4 had approximately 0 (zero) bytes fail to program, and the cells which did program had threshold voltages clustered at about 4.8 Volts and upwards.

Figure 5:
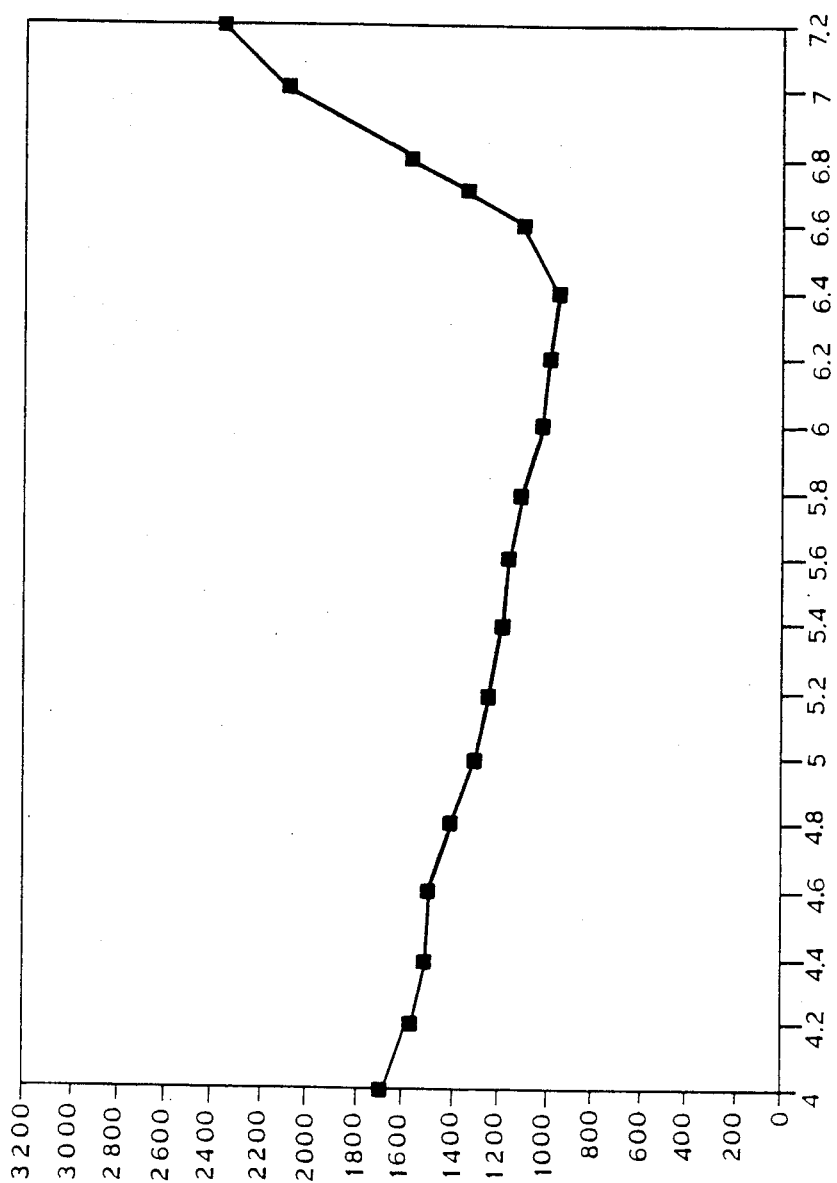

The device of FIG. 5 had approximately 1500 bytes fail to program, and the cells which did program had threshold voltages clustered at about 6.7 Volts and upwards. (It is not known why so many cells on this device failed to program: it may be that this device had a longer $L_{eff}$ than the others, and that the longer $L_{eff}$ was just beyond the point where hot electron generation is greatly reduced.)

Figure 6:
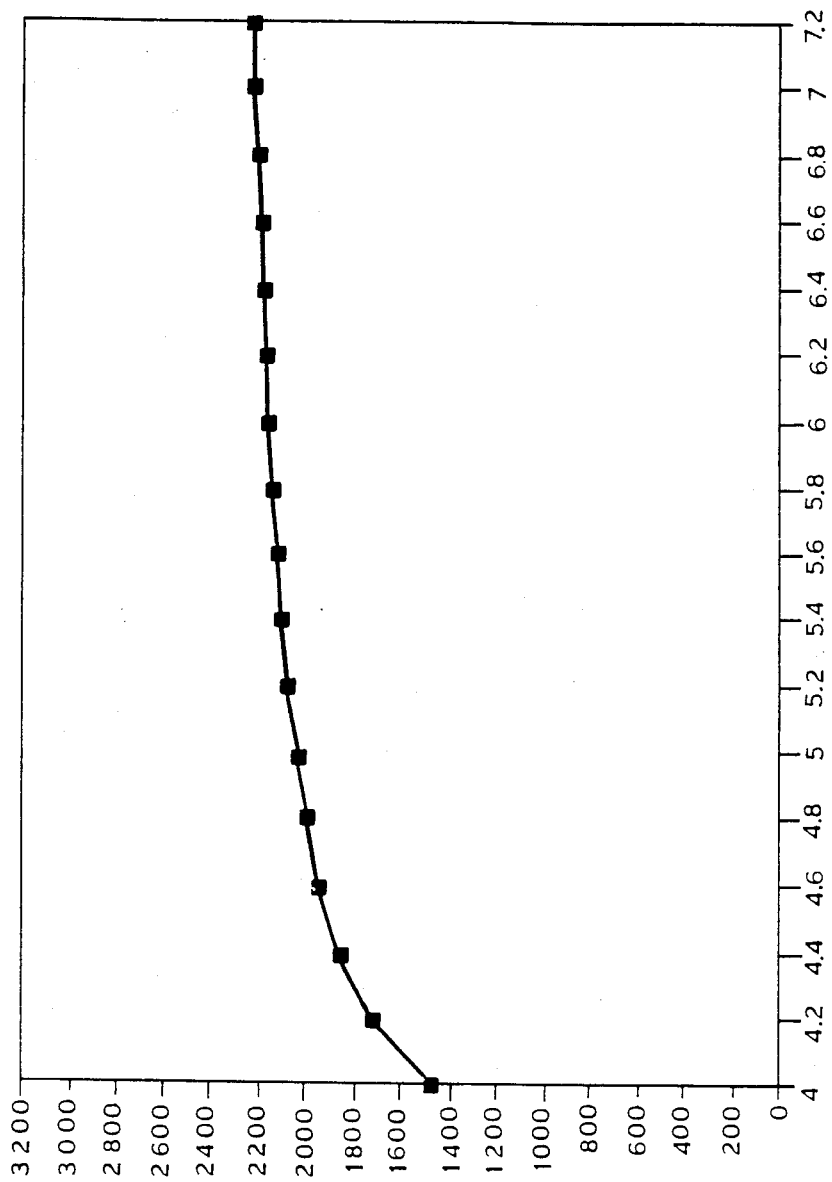

The device of FIG. 6 had approximately 1400 bytes fail to program, and the cells which did program had threshold voltages clustered at much less than 4 Volts.

Figure 7:
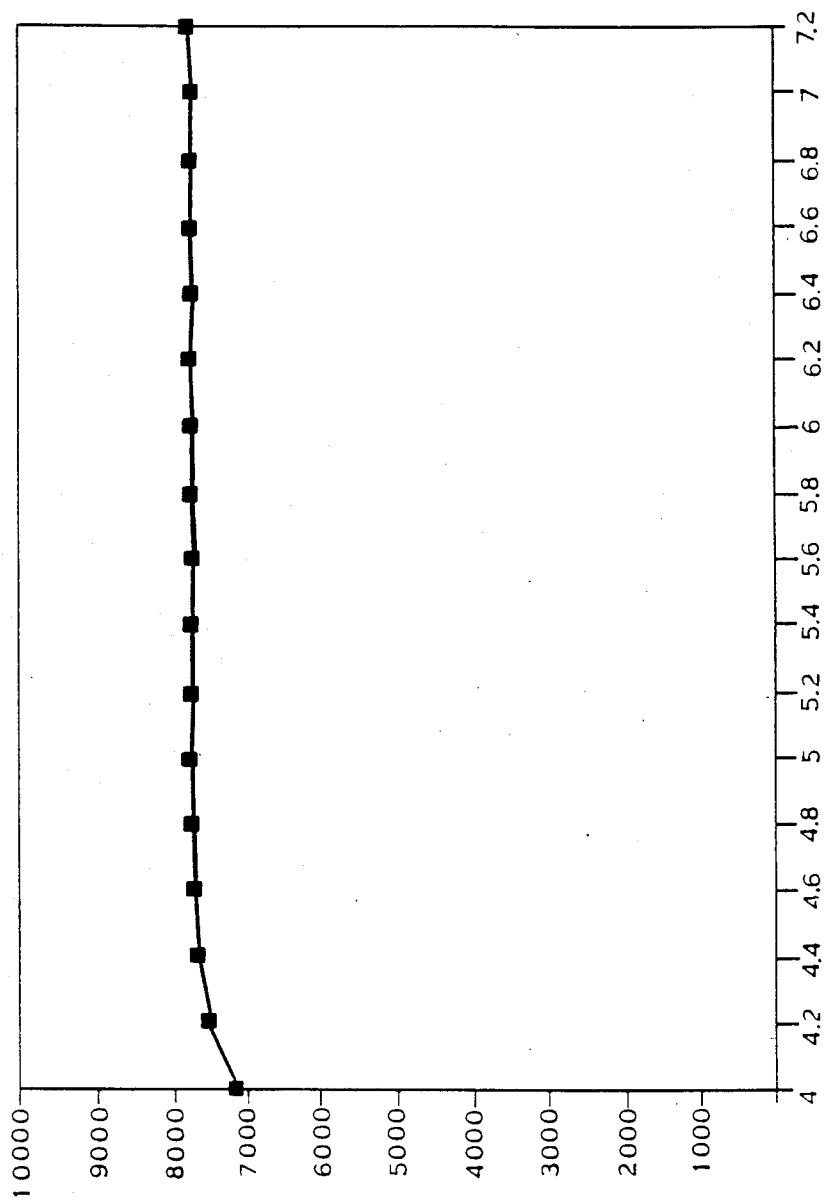

The device of FIG. 7 had approximately 7500 bytes fail to program, and the cells (if any) which did program had threshold voltages clustered at much less than 4 Volts.

Figure 8:
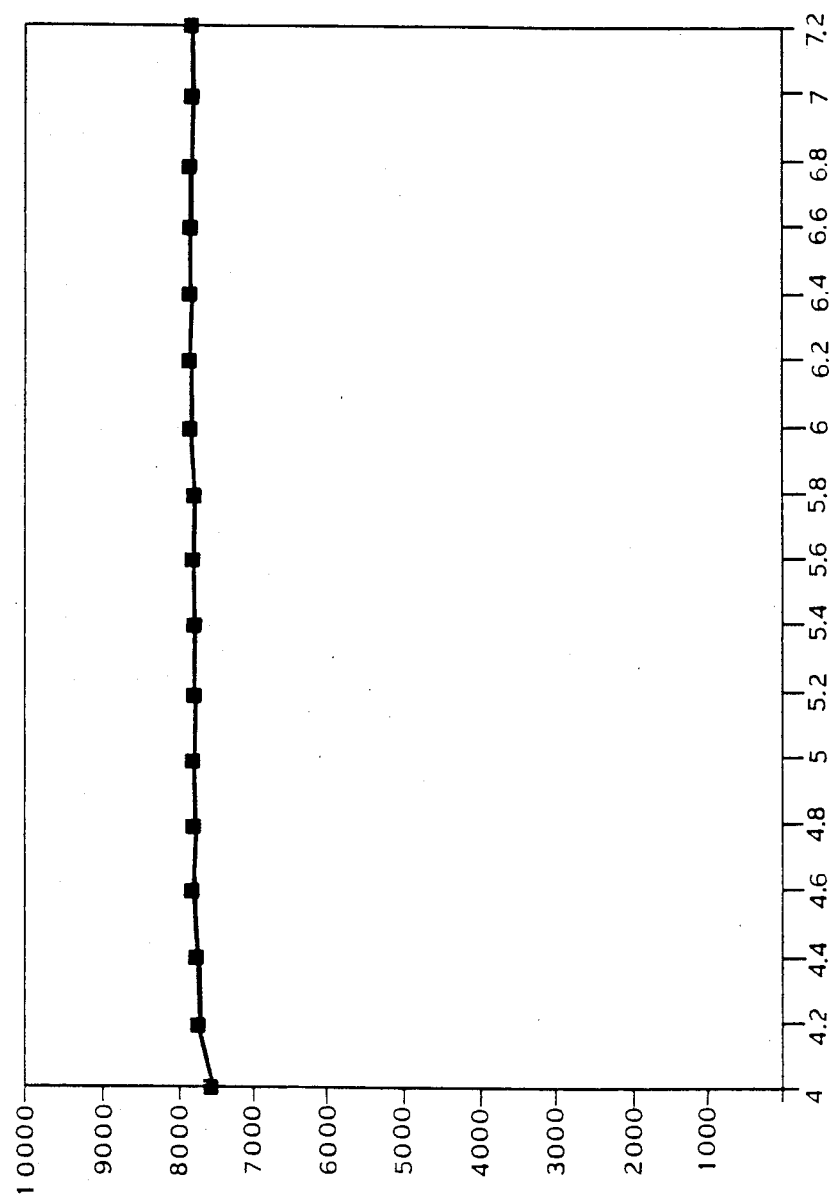
Figure 9:
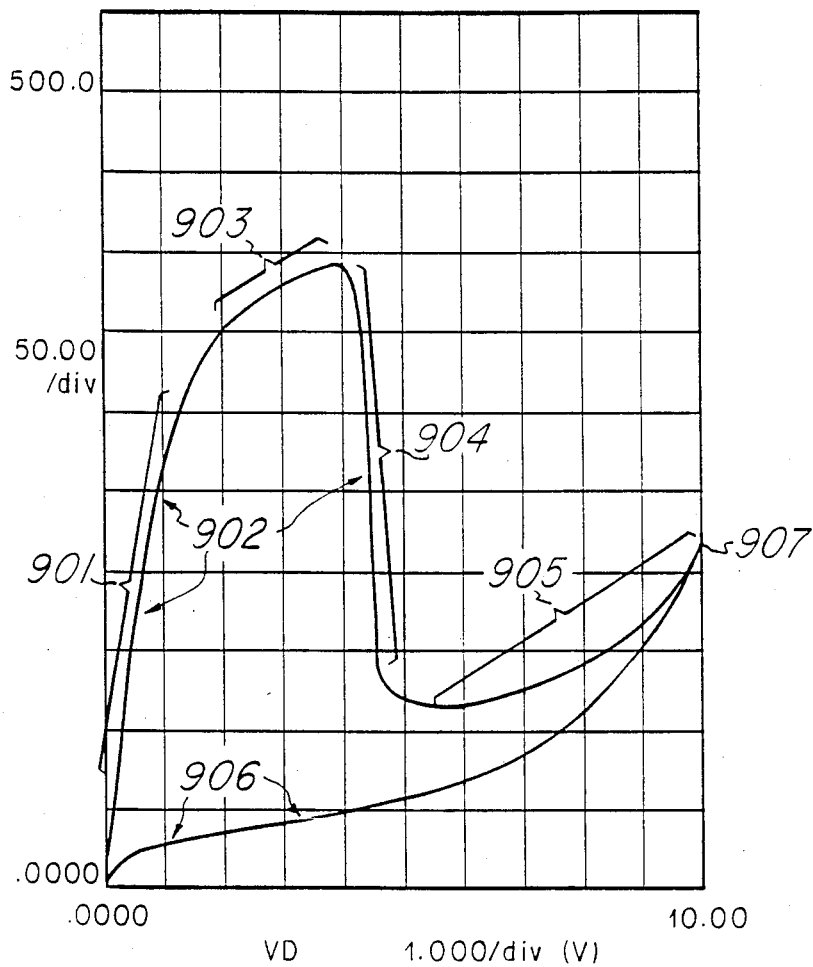
FIG. 9 shows sample I-V curves for an EPROM cell during and after programmation.

The device of FIG. 8 had essentially all bytes fail to program.

There were also a few minor differences in the processing of the various devices. The devices of FIGS. 2, 5, 7, and 8 grew the thick oxides at 900 C. over the buried n+ regions using a nitride mask, as in the sample process flow above, but the devices of FIGS. 3, 4, and 6 used differential oxidation at 800 C. instead. The devices of FIGS. 2 and 3 used 5E11 $cm^{-2}$ of arsenic together with 3E12 $cm^{-2}$ of boron, whereas the devices of FIGS. 4 and 5 used 1E12 $cm^{-2}$ of arsenic together with 3E12 $cm^{-2}$ of boron. The devices of FIGS. 2 through 6 used a bitline isolation implant dose of 1E12 $cm^{-2}$, as in the process flow above, but the devices of FIGS. 7 and 8 used a dose of 4E12 $cm^{-2}$ instead.

Arsenic is preferred for the $V_T$-adjust implant, to minimize its integral $\sqrt{Dt}$ by minimizing D. That is, in the presently preferred embodiment the boron implant has only a slightly longer stopping distance than the arsenic implant (roughly 1100 Å for the boron and 850 Å for the arsenic): however, the difference in their diffusivities means that subsequent diffusion will further shift the boron profile relative to the arsenic profile. The final dopant profile—i.e. the profiles in the finished device—are what determine the device characteristics, and the presently preferred embodiment provides final dopant profiles such that $$X_{B-50\%} > 2X_{As-50\%},$$

i.e. the boron concentration is 50% less than its peak value at a depth more than twice the depth where the arsenic concentration is 50% less than its peak value. More particularly, it is also preferred that $$2X_j > X_{B-50\%} > 2X_{As-50\%},$$

i.e. that the boron concentration has tapered off to half its maximum at a depth less than twice the depth of the source/drain bottom junction.

Another teaching of the present invention regarding final dopant profiles is that $n_{max(x \leq 0.5 \mu m)}$ (the largest value of the net p-type dopant concentration anywhere within the volume extending from 0 to 0.5 microns below the gate oxide/channel interface) is more than 1.5 times $n_{chan}$ (the net p-type dopant concentration in the channel at the gate oxide/channel interface):

$n_{max(x \leq 0.5 \mu m)} > 2/3(n_{chan})$.

Preferably, $n_{max(x \leq 0.5 \mu m)}$ is more than 1.5 times $n_{chan}$ and is also more than twice $n_{sub}$ (the net p-type background dopant concentration in the substrate):

$n_{max(x \leq 0.5 \mu m)} > 2/3(n_{chan})$

AND $n_{max(x \leq 0.5 \mu m)} > 2(n_{sub})$.

Once these teachings of the present invention are appreciated, it may be seen that other processing sequences could be used to achieve the desired dopant profile as taught by the present invention.

For example, antimony could be used for the shallow n-type implant which adjusts $V_T$. Even phosphorus could be used instead, although in that case a higher implant energy would be used for the boron implant, to assure that increased net p-type doping occurred below the channel as discussed above. Similarly, those skilled in the art can easily configure a wide range of implant dose, implant energy, and annealing time and temperature specifications which will provide the structure taught by the present invention by various routes, although there are particular advantages to the specific preferred process embodiments claimed.

Of course the polysilicon layers referred to do not have to be strictly polysilicon, but can be other materials which are substantially polycrystalline or amorphous and contain a large fraction of silicon: in this usage silicides and polysilicon/silicide sandwich structures are certainly comprehended, and future sandwich structures which have analogous deposition and eletrical properties in future processes to the place of polysilicon in present processes are intended to be comprehended also.

As will be appreciated by those skilled in the art, the present invention can be widely modified and varied, and its scope is not limited except as specified in the allowed claims.

What is claimed is:

1. A floating-gate memory device comprising:
peripheral transistors and memory transistors, said peripheral transistors comprising n-channel devices, said memory transistors each comprising:
a substrate having a p-type upper portion:
first and second heavily doped n-type source/drain regions separated to define a channel region in said p-type upper portion:
a gate oxide overlying said channel region, and a floating gate overlying said gate oxide:
a control gate overlying and insulated from said floating gate:
wherein the the largest value of the net p-type dopant concentration anywhere within the volume of said p-type upper portion extending from 0 to 0.5 microns directly below the interface between said gate oxide and said channel region is more than 1.5 times the net p-type dopant concentration in said channel region at the interface between said gate oxide and said channel region:
and wherein the maximum value of net p-type doping concentration within the upper portion of said substrate occurs at a depth which is shallower than the depth of said source/drain diffusions:
and wherein the background value of net p-type doping concentration within the upper portion of said substrate near said memory transistors is greater than the background value of net p-type doping concentration within the upper portion of said substrate near said n-channel peripheral transistors.

2. The device of claim 1, wherein said floating gate is nowhere substantially thinner than said gate oxide.

3. The device of claim 1, wherein said first and second source/drain regions are each substantially overlain by an oxide which is at least three times as thick as said gate oxide.

4. The device of claim 1, wherein said first and second source/drain regions are each substantially exposed at the surface of said semiconductor upper portion, and wherein said channel region is bounded at the edges thereof, where not bounded by the respective source/drain regions, by a thick field isolation region.

5. The device of claim 1, wherein said substrate has a p-type background doping in upper portions thereof of at least $1E16$ cm$^{-3}$.

6. The device of the preceding claim, wherein said substrate is a p-on-p+ epitaxial structure, and the epitaxial upper portions thereof have a background doping of at least $1E16$ cm$^{-3}$.

7. A floating-gate memory device comprising:
peripheral transistors and memory transistors, said peripheral transistors comprising n-channel devices, said memory transistors each comprising:
a substrate having a p-type upper portion:
first and second heavily doped n-type source/drain regions separated to define a channel region in said p-type upper portion:
a gate oxide overlying said channel region, and a floating gate overlying said gate oxide:
a control gate overlying and insulated from said floating gate:
wherein the largest value of the net p-type dopant concentration anywhere within the volume of said p-type upper portion extending from 0 to 0.5 microns directly below the interface between said gate oxide and said channel region
is more than 1.5 times the net p-type dopant concentration in said channel region at the interface between said gate oxide and said channel region
and is also more than twice the net p-type background dopant concentration in the substrate upper portion:
and wherein the maximum value of net p-type doping concentration within the upper portion of said substrate occurs at a depth which is shallower than the depth of said source/drain diffusions:
and wherein the background value of net p-type doping concentration within the upper portion of said substrate near said memory transistors is equal to or greater than the background value of of net p-type doping concentration within the upper portion of said substrate near said n-channel peripheral transistors.

8. The device of claim 7, wherein said floating gate is nowhere substantially thinner than said gate oxide.

9. The device of claim 7, wherein said first and second source/drain regions are each substantially overlain by an oxide which is at least three times as thick as said gate oxide.

10. The device of claim 7, wherein said first and second source/drain regions are each substantially exposed at the surface of said semiconductor upper portion, and wherein said channel region is bounded at the edges thereof, where not bounded by the respective source/drain regions, by a thick field isolation region.

11. The device of claim 7, wherein said substrate has a p-type background doping in upper portions thereof of at least 1E16 cm$^{-3}$.

12. The device of the preceding claim, wherein said substrate is a p-on-p+ epitaxial structure, and the epitaxial upper portions thereof have a background doping of at least 1E16 cm$^{-3}$.

13. A floating-gate memory device comprising:
a substrate having a p-type upper portion:
first and second heavily doped n-type source/drain regions separated to define a channel region in said p-type upper portion:
a gate oxide overlying said channel region, and a floating gate overlying said gate oxide:
a control gate overlying and insulated from said floating gate:
wherein said upper portion of said substrate directly beneath said gate oxide includes both
atoms of a p-type dopant species and
atoms of an n-type dopant species,
said p-type dopant species and said n-type dopant species having vertical concentration profiles such that
the depth at which the concentration of said p-type dopant species declines to 50% less than its near-surface peak value
is more than two times
the depth at which the concentration of said n-type dopant species declines to 50% less than its near-surface peak value.

14. The device of claim 13, wherein said p-type dopant is boron and said n-type dopant is predominantly arsenic.

15. The device of claim 13, wherein said n-type dopant is arsenic.

16. The device of claim 13, wherein said n-type dopant is antimony.

17. The device of claim 13, wherein said p-type dopant is boron.

18. The device of claim 13.
wherein the net p-type dopant concentration of said upper portion of said substrate
at locations sufficiently far from said gate oxide that said p-type dopant concentration has declined to approximately a uniform level
is in the range of 5E15 cm$^{-3}$ to 1.5E16 cm$^{-3}$, inclusive.

19. The device of claim 13, wherein the depth of said source/drain diffusions is in the range of 0.4 to 0.8 microns inclusive.

20. The device of claim 13, wherein said floating gate is nowhere substantially thinner than said gate oxide.

21. The device of claim 13, wherein said first and second source/drain regions are each substantially overlain by an oxide which is at least three times as thick as said gate oxide.

22. The device of claim 13, wherein said first and second source/drain regions are each substantially exposed at the surface of said semiconductor upper portion, and wherein said channel region is bounded at the edges thereof, where not bounded by the respective source/drain regions, by a thick field isolation region.

23. The device of claim 13, wherein said substrate has a p-type background doping in upper portions thereof of at least 1E16 cm$^{-3}$.

24. The device of the preceding claim, wherein said substrate is a p-on-p+ epitaxial structure, and the epitaxial upper portions thereof have a background doping of at least 1E16 cm$^{-3}$.

25. A floating-gate memory device comprising:
a substrate having a p-type upper portion:
first and second heavily doped n-type source/drain regions separated to define a channel region in said p-type upper portion:
a gate oxide overlying said channel region, and a floating gate overlying said gate oxide:
a control gate overlying and insulated from said floating gate;
wherein said upper portion of said substrate directly beneath said gate oxide includes both
atoms of a p-type dopant species and
atoms of an n-type dopant species,
said p-type dopant species and said n-type dopant species having vertical concentration profiles such that
the depth at which the concentration of said p-type dopant species declines to 50% less than its near-surface peak value is more than two times the depth at which the concentration of said n-type dopant species declines to 50% less than its near-surface peak value,
and the depth at which the concentration of said p-type dopant species declines to 50% less than its near-surface peak value is less than two times the depth of said source/drain diffusions.

26. The device of claim 25, wherein said p-type dopant is boron and said n-type dopant is predominantly arsenic.

27. The device of claim 25, wherein said n-type dopant is arsenic.

28. The device of claim 25, wherein said n-type dopant is antimony.

29. The device of claim 25, wherein said p-type dopant is boron.

30. The device of claim 25.
wherein the net p-type dopant concentration of said upper portion of said substrate
at locations sufficiently far from said gate oxide that said p-type dopant concentration has declined to approximately a uniform level
is in the range of 8E15 cm$^{-3}$ to 1.5E16 cm$^{-3}$, inclusive.

31. The device of claim 25, wherein the depth of said source/drain diffusions is in the range of 0.4 to 0.8 microns inclusive.

32. The device of claim 25, wherein said floating gate is nowhere substantially thinner than said gate oxide.

33. The device of claim 25, wherein said first and second source/drain regions are each substantially overlain by an oxide which is at least three times as thick as said gate oxide.

34. The device of claim 25, wherein said first and second source/drain regions are each substantially exposed at the surface of said semiconductor upper portion, and wherein said channel region is bounded at the edges thereof, where not bounded by the respective source/drain regions, by a thick field isolation region.

35. The device of claim 25, wherein said substrate has a p-type background doping in upper portions thereof of at least 1E16 cm$^{-3}$.

36. The device of the preceding claim, wherein said substrate is a p-on-p+ epitaxial structure, and the epitaxial upper portions thereof have a background doping of at least 1E16 cm$^{-3}$.

* * * * *